(12) United States Patent
Grebennikov et al.

(10) Patent No.: US 7,940,120 B2
(45) Date of Patent: May 10, 2011

(54) POWER AMPLIFIER LINEARIZATION USING RF FEEDBACK

(75) Inventors: Andrei Grebennikov, Dublin (IE); Florian Pivit, Dublin (IE)

(73) Assignee: Alcatel Lucent, Paris (FR)

( * ) Notice: Subject to any disclaimer, the term of this patent is extended or adjusted under 35 U.S.C. 154(b) by 68 days.

(21) Appl. No.: 12/461,847

(22) Filed: Aug. 26, 2009

(65) Prior Publication Data

US 2010/0060353 A1 Mar. 11, 2010

(30) Foreign Application Priority Data

Sep. 9, 2008 (EP) ..................................... 08290846

(51) Int. Cl.
*H03F 3/68* (2006.01)
(52) U.S. Cl. ......................... 330/149; 330/291; 330/293
(58) Field of Classification Search .................. 330/149, 330/151, 291, 293
See application file for complete search history.

(56) References Cited

U.S. PATENT DOCUMENTS

| | | |
|---|---|---|
| 3,638,134 A | 1/1972 | Beurrier et al. |
| 4,490,684 A | 12/1984 | Epsom et al. |
| 6,268,768 B1 | 7/2001 | Blodgett et al. |
| 6,486,734 B2 * | 11/2002 | Oguro et al. .................. 330/149 |

OTHER PUBLICATIONS

"Quadrature Hybrids 90° Power Dividers/combiners 10 kHz to 40 GHz General Information", Mar. 21, 1996.

* cited by examiner

*Primary Examiner* — Michael B Shingleton
(74) *Attorney, Agent, or Firm* — Harness, Dickey & Pierce

(57) ABSTRACT

The power amplifier mainly includes a main amplifier, two splitters, one combiner, one subtracter, two phase shifters, one attenuator and one error amplifier. The splitters, subtracter and combiner are designed in the form of 90-degree or quadrature hybrid couplers. A quadrature hybrid can be implemented with any lumped or transmission-line elements and has an important advantage compared to the in-phase splitter that at equal values of reflection coefficients from loads connected to the in phase and 90° phase shift terminals, the reflection wave is lacking at the main input terminal and, consequently, the input voltage standing wave ratio of a quadrature hybrid does not depend on the equal load mismatch level.

7 Claims, 3 Drawing Sheets

POWER AMPLIFIER LINEARIZATION USING RF FEEDBACK

CROSS REFERENCE TO RELATED APPLICATIONS

The present application claims priority to and incorporates by reference the entire contents of European Patent Application No. 08290846.8 filed on Sep. 9, 2008.

BACKGROUND OF THE INVENTION

The present invention relates to a power amplifier having an input connected to a main port of a quadrature hybrid splitter, said quadrature hybrid splitter having an in-phase port coupled to an output of said power amplifier through a main amplifier and another quadrature hybrid, said quadrature hybrid splitter further having a 90° phase shift port also coupled of said other quadrature hybrid.

Such a power amplifier PA is already known in communication systems, such as Global System for Mobile communications/Enhanced Data rates for GSM Evolution GSM/EDGE, code-division multiple-access CDMA2000, wideband code-division multiple-access W-CDMA and Long Term Evolution LTE, where it is required to operate with high efficiency and high linearity simultaneously.

However, there is a tradeoff between efficiency and linearity with improvement in one coming at the expense of another. Generally, the basic linearization approaches are based on analog and digital correction techniques. Conventional base station architectures usually contain power amplifiers, which generate output power levels of 100 W and higher in two single transistor elements.

To linearize such PAs, usually Digital PreDistortion DPD is applied. Digital linearization systems require digital adaptive processing based on periodically updated look-up tables and feedback path to be able to properly react to changes due to the load, process, temperature, or supply voltage variations. The correction factors for amplitude and phase computed using the adaptation algorithm are stored in the look-up tables, and are dynamically updated to reduce errors between the predistorter input and the power amplifier output. However, a substantial linearity improvement comes without incurring a bandwidth limitation when the power amplifier can be considered memoryless, which is not the case for wideband telecommunication standards like CDMA200 or WCDMA.

As said, the complexity of the adaptive digital predistortion system is a serious drawback because it is implemented with considerable computing power of a digital signal processor. For adaptive predistortion, it is also necessary to carefully model the power amplifier transfer characteristic. DPD is a very effective and efficient linearization method, if the computational effort, the cost and energy consumption of the sampling receiver, the large bandwidth of the transceiver chain and the resulting complexity of the diplexer filter are in a low ratio compared to the generated RF-power levels. Usually for high-power-applications in the order of several ten or even 100 Watts this is the case. But as soon as the number of power amplifiers in a base station increases, as it is the case in distributed and active antenna applications, this effort gets prohibitively expensive: e.g. in an active antenna for macro-base-station applications the number of transceiver elements is about eight to ten. To install an individual Digital PreDistortion-Field Programmable Gate Array DPD-FPGA, an individual sampling receiver and a complex duplex filter in each antenna element is prohibitive in terms of form factor, cost and weight. In such cases an alternative, cheap, efficient and effective linearization method has to be applied. The proposed method is of such a kind: it is an analog linearization method with increased efficiency and low implementation cost.

Existing feedforward power amplifiers which improve linearity already exist, but those are of inherently low efficiency. Such a basic analog linearization solution represents a feedforward power amplifier configuration which block schematic is shown at FIG. 1. The feedforward power amplifier system includes the main amplifier (MA11), three couplers (the quadrature hybrid splitter (SP11), a subtracter (SU11), and the other quadrature hybrid (CO11) that is a combiner), two phase shifters (PH11, PH12), two attenuators (AT11, AT12), and error amplifier (EA11).

The operation of the feedforward linearization circuit is based on the subtraction of two equal signals with subsequent cancellation of the error signal in the amplifier output spectrum. Its operation principle can be demonstrated by the two-tone test spectra at various points of the block diagram. The input signal is split to form the two identical parts, although in a common case the ratio used in the splitting process does not need to be equal. Then, a portion of the main amplifier output signal coupled by the coupler-subtracter is subtracted from a time-delayed and opposite phase portion of the original signal to remain an error signal only. The result of this subtraction is an error signal that ideally contains nonlinear distortion only generated by the main amplifier. The error signal is then amplified linearly to the required level in order to cancel the distortion in the main part and fed to the output combiner, on the other input of which a time-delayed and opposite-phase main-path signal is forwarded.

The resulting signal at the feedforward linearization system output is an error-free signal and an amplified version of the original input signal. However, efficiency in this feedforward system is very low because the power consumption of the error amplifier is significant in order to obtain the required error signal at the output. In addition, the phase shifter and attenuator at the output path make a significant contribution to the overall system power loss.

SUMMARY OF THE INVENTION

An object of the present invention is to provide a power amplifier of the above known type but whereof the efficiency is improved while maintaining at least a same good linearity.

According to the invention, this object is achieved due to the fact that said power amplifier further comprises a quadrature hybrid combiner having a main port connected to the in-phase port of said quadrature hybrid splitter and a 90° phase shift port connected to an input of said main amplifier, an output of said main amplifier being connected to an in-phase port of said other quadrature hybrid, that the 90° phase shift port of said quadrature hybrid splitter is connected to a first input of a subtracter of which an output is coupled to an isolated port of said quadrature hybrid combiner via a first phase shifter, that said other quadrature hybrid further has a 90° phase shift port coupled to a second input of said subtracter via a second phase shifter, and that said other quadrature hybrid further has a main port connected to the output of said power amplifier.

In this way, the amplifier is inherently linearized and does not require feedback loops and transmitter chains of excessively large bandwidths like e.g. in amplifiers with DPD. As a consequence, significantly higher efficiency is provided for the same linearity as common feedforward methods. In other words, the amplifier simultaneously provides high efficiency and high linearity for RF signals.

Another characterizing embodiment of the present invention is that said each of said quadrature hybrids has a main port adapted to receive an input signal, an in-phase port adapted to provide a first output signal substantially in phase with said input signal, a 90° phase shift port adapted to provide a second output signal exhibiting a relative 90° phase shift with respect to the phase of said first output signal, and an isolated port. The latter isolated port is coupled either to the ground through an impedance in case of a quadrature hybrid splitter or to the output of an error amplifier in case of the quadrature hybrid combiner.

The quadrature hybrids as such are for instance known from the document "Quadrature Hybrids 90° Power Dividers/Combiners 10 KHz To 40 GHz General Information" available on the Internet at
<www.merrimacind.com/rfmw/05intro_quadhybrids.pdf>

A quadrature hybrid has an important advantage compared to in-phase splitter that at equal values of reflection coefficients from loads connected to the in-phase port and 90° phase shift port or respective, or respective output terminals 2 and 3, the reflection wave is lacking at the main port or input terminal 1 and, consequently, the input voltage standing wave ratio of a quadrature hybrid does not depend on the equal load mismatch level.

Further characterizing embodiments of the present power amplifier are mentioned in the appended claims.

It is to be noticed that the term 'comprising', used in the claims, should not be interpreted as being restricted to the means listed thereafter. Thus, the scope of the expression 'a device comprising means A and B' should not be limited to devices consisting only of components A and B. It means that with respect to the present invention, the only relevant components of the device are A and B.

Similarly, it is to be noticed that the term 'coupled', also used in the claims, should not be interpreted as being restricted to direct connections only. Thus, the scope of the expression 'a device A coupled to a device B' should not be limited to devices or systems wherein an output of device A is directly connected to an input of device B. It means that there exists a path between an output of A and an input of B which may be a path including other devices or means.

BRIEF DESCRIPTION OF THE DRAWINGS

The above and other objects and features of the invention will become more apparent and the invention itself will be best understood by referring to the following description of an embodiment taken in conjunction with the accompanying drawings wherein.

DETAILED DESCRIPTION OF EXAMPLE EMBODIMENTS

Figure 1:
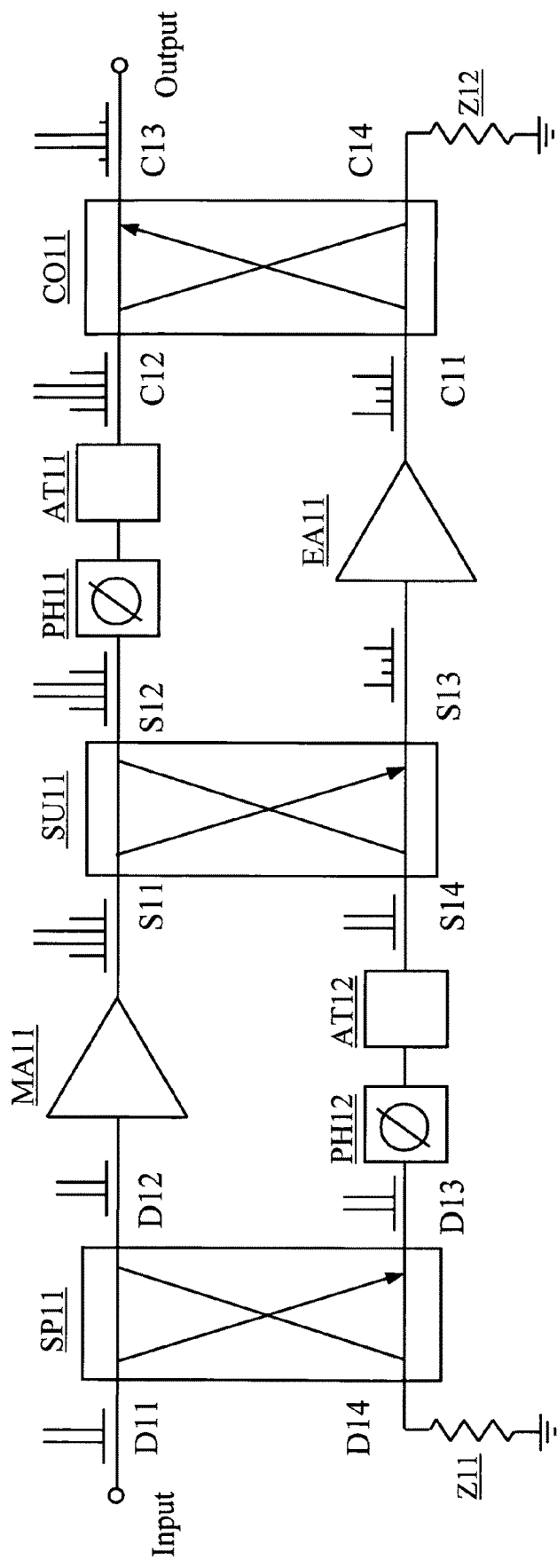
FIG. 1 represents a feedforward power amplifier as known from the prior art.

The feedforward power amplifier shown at FIG. 1 is known from the prior art and includes a main amplifier MA11, a quadrature hybrid splitter SP11, a quadrature hybrid subtracter SU11, quadrature hybrid combiner CO11, two phase shifters PH11 and PH12, two attenuators AT11 and AT12, and error amplifier EA11.

The operation of this feedforward linearization circuit is based on the subtraction of two equal signals with subsequent cancellation of the error signal in the amplifier output spectrum. Its operation principle can be demonstrated by the two-tone test spectra at various points of the block diagram. The input signal D11 is split to form the two identical parts D12 and D13, although in a common case the ratio used in the splitting process SP11 does not need to be equal. Then, a portion S11 of the main amplifier output signal coupled by the coupler-subtracter SU11 is subtracted from a time-delayed and opposite phase portion S14 of the original signal to remain an error signal S13 only. The result of this subtraction is an error signal S13 that ideally contains nonlinear distortion only generated by the main amplifier MA11. The error signal is then amplified linearly to the required level C11 in order to cancel the distortion in the main part and fed to the output combiner CO11, on the other input of which a time-delayed and opposite-phase main-path signal C12 is forwarded.

The resulting signal C13 at the feedforward linearization system output is an error-free signal and an amplified version of the original input signal D11. However, efficiency in this feedforward system is very low because the power consumption of the error amplifier EA11 is significant in order to obtain the required error signal C11 at the output. In addition, the phase shifter PH11 and attenuator AT11 at the output path make a significant contribution to the overall system power loss.

Figure 2:
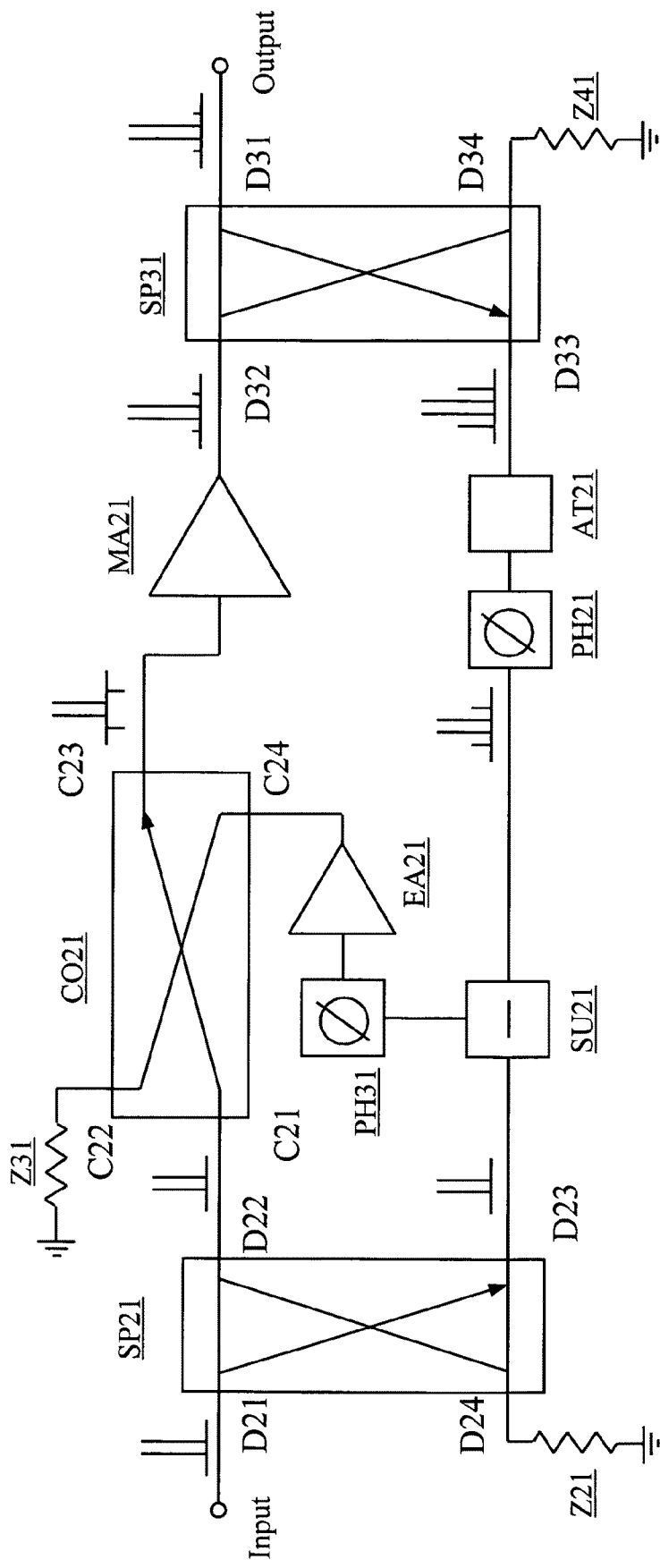
FIG. 2 represents a power amplifier according to the invention.

Instead of using an inefficient feedforward, the power amplifier of the present invention uses a RF feedback path to create an input predistortion signal. This power amplifier that is a linearized RF feedback system is shown at FIG. 2. It mainly includes a main amplifier MA21, two splitters SP21 and SP31, one combiner CO21, one subtracter SU21, two phase shifters PH21 and PH31, one attenuator AT21, and one error amplifier EA21.

In more detail, the present power amplifier has an input connected to a main port D21 of a first quadrature hybrid splitter SP21; more details about quadrature hybrids will be given later.

The quadrature hybrid splitter SP21 has an in-phase port D22 connected to a main port C21 of the quadrature hybrid combiner CO21, coupled to an output of the power amplifier through the main amplifier MA21 and a second quadrature hybrid splitter SP31, a 90° phase shift port D23 connected to a first input of the subtracter SU21, and an isolated port D24 connected to ground via impedance Z21.

The quadrature hybrid combiner CO21 has a 90° phase shift port C23 connected to an input of the main amplifier MA21, and an isolated port C24 connected to the output of the error amplifier EA21.

An output of the main amplifier MA21 is connected to an in-phase port D32 of the second quadrature hybrid splitter SP31, of which a main port D31 is connected to the output of the power amplifier and an isolated port D34 is connected to ground via impedance Z41. The second quadrature hybrid splitter SP31 further has a 90° phase shift port D33 connected to a second input of the subtracter SU21 through the series connection of a phase shifter PH21 and the attenuator AT21.

The subtracter SU21 has an output connected to an isolated port C24 of the quadrature hybrid combiner CO21 through the series connection of another phase shifter PH31 and the error amplifier EA21. In this case, an in-phase port D22 and an isolated port C24 are isolated from each other, so neither input signal flows to the output of an error amplifier, nor error signal flows to the input. As a result, the properly phased error signal amplified by the error amplifier EA21 flows to the input of the main amplifier MA21 and to the load impedance Z31 only.

The operation of this system is based on the subtraction of two equal signals with subsequent adding of the error signal with opposite phase to the amplifier input spectrum. First, the input signal D21, all signals being like-labeled as the ports where there are available, is split to form the two identical parts D22 and D23, although in a common case the ratio used in the splitting process does not need to be equal. At the same time, a time-delayed and opposite-phase portion of the main amplifier output signal coupled by the splitter into the RF feedback path is subtracted from a portion of the original signal to remain an error signal only. The result of this subtraction is an error signal that essentially contains ideally the nonlinear distortion only provided by the main amplifier MA21.

The error signal is then amplified linearly by the error amplifier EA21 to the required level and properly phased to compensate for the power amplifier nonlinear distortion when it is added to its input.

The combiner usually represents a 90-degree hybrid coupler which means that the error signal is delivered to the input of the main amplifier only, and no error signal flows to the system input. The resulting signal at the output of the linearized system with RF feedback is an error free signal in an ideal case or essentially an amplified version of the original input signal in real practice.

In this system, the consumption of the error amplifier is lower than in the above known feedforward case, since the required power level of the error signal is lower by a factor which equals the main amplifier power gain. In addition, there is no need to use lossy attenuators and phase shifters at the main amplifier output.

Figure 3:
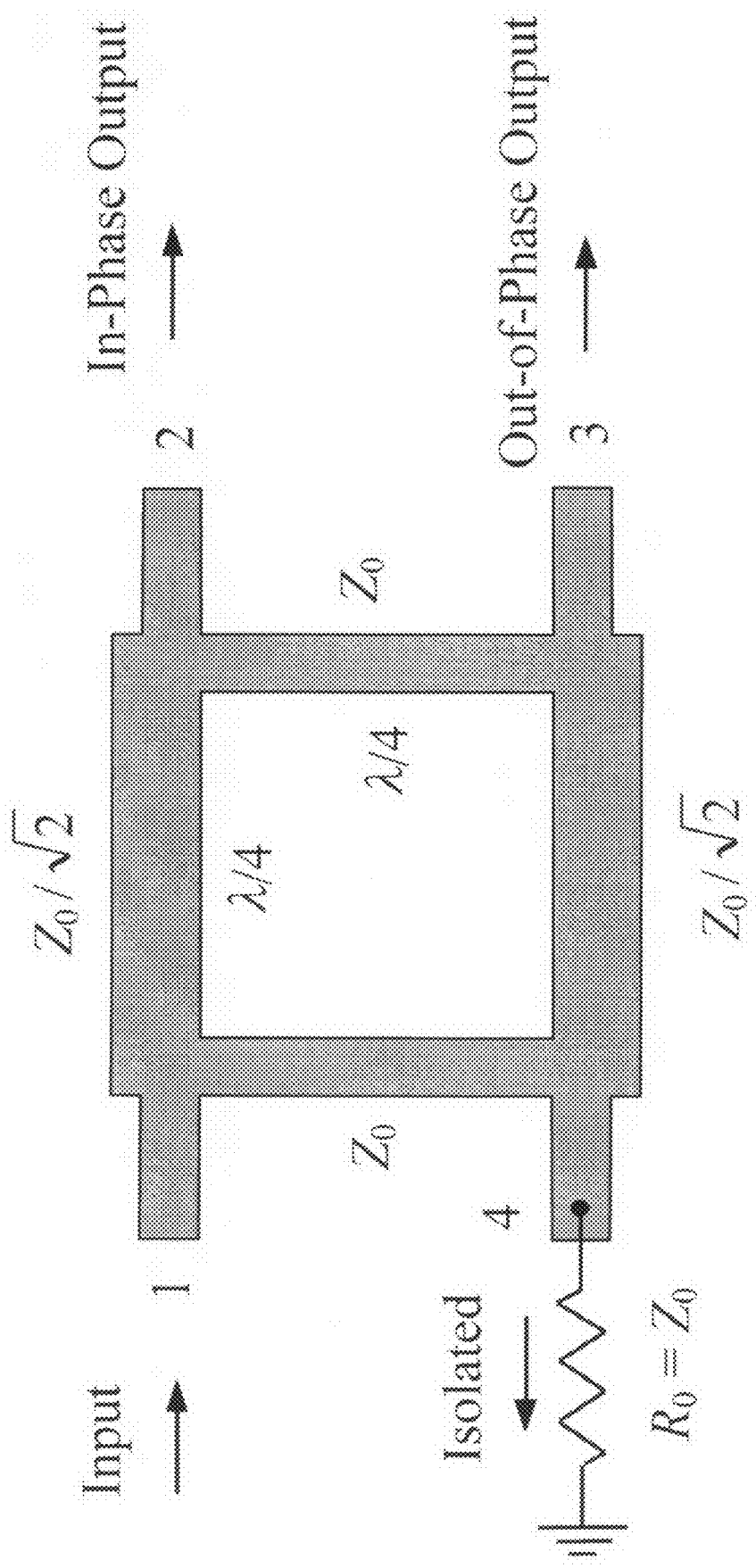
FIG. 3 is a block schematic of a quadrature hybrid used in the present power amplifier.

The splitters, subtracters and combiners mentioned above can be designed in the form of 90-degree hybrid couplers as shown at FIG. 3. A 90-degree hybrid coupler or quadrature hybrid is for instance known from the document "Quadrature Hybrids 90° Power Dividers/Combiners 10 KHz To 40 GHz General Information" available on the Internet at
<www.merrimacind.com/rfmw/05intro_quadhybrids.pdf>

Therein is mentioned that the 90° Power Dividers/Combiners are four port networks capable of operating from 10 kHz to 40 GHz and available in a wide variety of package options. These devices can perform two complementary functions:

a) Power Divider: One function is to equally divide an input signal into two output signals while imparting to one of the outputs a 90° phase shift with respect to the phase of the other output. Thus, the outputs exhibit a quadrature relationship meaning their respective phases differ by one "quadrant" or simply 90°; and b) Combiner: The complementary function is to combine two equal amplitude, quadrature-phased input signals into a single output signal.

As an example, when all ports are matched for a hybrid branch-line combiner shown in FIG. 3, the power entering input port 1, referred above as main port or merely Input, is divided between the output port 2, referred above as in-phase port or In-Phase Output, and port 3, referred above as 90° phase shift port or Out-of-Phase Output, with a 90° phase shift between these outputs, and no power is delivered to the Isolated port 4.

The quadrature hybrid can generally be implemented with any lumped or quarter-wavelength $\lambda/4$ transmission-line elements. A first quarter-wavelength $\lambda/4$ transmission line having a characteristic impedance $Zo/\sqrt{2}$ is connected between the ports 1 and 2. A second quarter-wavelength $\lambda/4$ transmission line also having a characteristic impedance $Zo/\sqrt{2}$ is connected between the ports 4 and 3. A third quarter-wavelength $\lambda/4$ transmission line having characteristic impedance $Zo$ is connected between the ports 1 and 4. A fourth quarter-wavelength $\lambda/4$ transmission line also having characteristic impedance $Zo$ is connected between the ports 2 and 3

In the above example, all reflected power is dissipated in 50Ω ballast resistor $R_0=Z_0$ connected to the isolated port 4. The subtracter can be represented by an in-phase (0 degree) or out-of-phase (180 degree) combiner.

It is to be noted that the number of stages in the power amplifier may differ, depending on the required output power and power gain.

A final remark is that embodiments of the present invention are described above in terms of functional blocks. From the functional description of these blocks, given above, it will be apparent for a person skilled in the art of designing electronic devices how embodiments of these blocks can be manufactured with well-known electronic components. A detailed architecture of the contents of the functional blocks hence is not given.

While the principles of the invention have been described above in connection with specific apparatus, it is to be clearly understood that this description is merely made by way of example and not as a limitation on the scope of the invention, as defined in the appended claims.

The invention claimed is:

1. A power amplifier having an input connected to a main port of a quadrature hybrid splitter, said quadrature hybrid splitter having an in-phase port coupled to an output of said power amplifier through a main amplifier and another quadrature hybrid, said quadrature hybrid splitter further having a 90° phase shift port also coupled of said other quadrature hybrid, wherein said power amplifier further comprises a quadrature hybrid combiner having a main port connected to the in-phase port of said quadrature hybrid splitter and a 90° phase shift port connected to an input of said main amplifier, an output of said main amplifier being connected to an in-phase port of said other quadrature hybrid, wherein the 90° phase shift port of said quadrature hybrid splitter is connected to a first input of a subtracter of which an output is coupled to an isolated port of said quadrature hybrid combiner via a first phase shifter, wherein said other quadrature hybrid further has a 90° phase shift port coupled to a second input of said subtracter via a second phase shifter, wherein said other quadrature hybrid further has a main port connected to the output of said power amplifier.

2. The power amplifier according to claim 1, wherein the output of said subtracter is coupled to the isolated port of said quadrature hybrid combiner through the series connection of said first phase shifter and an error amplifier.

3. The power amplifier according to claim 1, wherein the 90° phase shift port of said other quadrature hybrid is coupled to the second input of said subtracter through the series connection of said second phase shifter and an attenuator.

4. The power amplifier according to claim 1, wherein said other quadrature hybrid is a second quadrature hybrid splitter.

5. The power amplifier according to claim 1, wherein each of said quadrature hybrids has a main, port adapted to receive an input signal, an in-phase port adapted to provide a first output signal substantially in phase with said input signal, a 90° phase shift port adapted to provide a second output signal exhibiting a relative 90° phase shift with respect to the phase of said first output signal, and an isolated port.

6. The power amplifier according to claim 5, wherein the isolated port of each quadrature hybrid splitter is coupled to the ground through an impedance.

7. The power amplifier according to claim 5, wherein the isolated port of said quadrature hybrid combiner is coupled to the output of an error amplifier.

* * * * *